(12) United States Patent
Kozhukh et al.

(10) Patent No.: US 9,499,912 B2
(45) Date of Patent: Nov. 22, 2016

(54) COPOLYMERS OF DIGLYCIDYL ETHER TERMINATED POLYSILOXANE COMPOUNDS AND NON-AROMATIC POLYAMINES

(71) Applicant: Rohm and Haas Electronic Materials LLC, Marlborough, MA (US)

(72) Inventors: Julia Kozhukh, Cambridge, MA (US); Zuhra I. Niazimbetova, Westborough, MA (US); Kristen M. Milum, Boylston, MA (US)

(73) Assignee: Rohm and Haas Electronic Materials LLC

( * ) Notice: Subject to any disclaimer, the term of this patent is extended or adjusted under 35 U.S.C. 154(b) by 0 days.

(21) Appl. No.: 14/287,075

(22) Filed: May 26, 2014

(65) Prior Publication Data

US 2015/0342063 A1    Nov. 26, 2015

(51) Int. Cl.
| | |
|---|---|
| H05K 3/42 | (2006.01) |
| C23C 18/31 | (2006.01) |
| H05K 3/18 | (2006.01) |
| H05K 1/03 | (2006.01) |
| C09D 183/14 | (2006.01) |
| C09D 183/08 | (2006.01) |
| C08G 77/388 | (2006.01) |
| C08L 83/08 | (2006.01) |
| G03F 7/075 | (2006.01) |
| C23C 18/18 | (2006.01) |

(52) U.S. Cl.
CPC ............. *C23C 18/31* (2013.01); *C08G 77/388* (2013.01); *C08L 83/08* (2013.01); *C09D 183/08* (2013.01); *C09D 183/14* (2013.01); *C23C 18/18* (2013.01); *G03F 7/0751* (2013.01); *H05K 1/03* (2013.01); *H05K 3/181* (2013.01); *H05K 3/422* (2013.01); *H05K 3/427* (2013.01); *H05K 2201/09581* (2013.01)

(58) Field of Classification Search
CPC .......................... C09D 183/04; C08G 77/14
See application file for complete search history.

(56) References Cited

U.S. PATENT DOCUMENTS

| | | |
|---|---|---|
| 3,978,252 A | 8/1976 | Lombardo et al. |
| 4,976,990 A | 12/1990 | Bach et al. |
| 5,114,754 A | 5/1992 | Cronin et al. |
| 5,194,928 A | 3/1993 | Cronin et al. |
| 5,385,787 A | 1/1995 | Minten |
| 5,545,429 A | 8/1996 | Booth et al. |
| 5,616,230 A | 4/1997 | Otsuka et al. |
| 6,596,060 B1 | 7/2003 | Michaud |
| 6,780,467 B2 | 8/2004 | Imori |
| 6,835,419 B2 | 12/2004 | Herzig et al. |
| 7,045,461 B2 | 5/2006 | Imori et al. |
| 7,713,340 B2 | 5/2010 | Kawamura et al. |
| 7,858,146 B2 | 12/2010 | Poole et al. |
| 7,867,564 B2 | 1/2011 | Imori et al. |
| 2004/0028827 A1* | 2/2004 | Herzig .................... C03C 17/30 427/387 |
| 2007/0269680 A1 | 11/2007 | Kawamura et al. |
| 2008/0248317 A1 | 10/2008 | Tsuchida et al. |
| 2010/0068960 A1 | 3/2010 | Soane et al. |
| 2014/0004266 A1 | 1/2014 | Wasserfallen et al. |

FOREIGN PATENT DOCUMENTS

| | | |
|---|---|---|
| JP | 03277463 B2 | 4/2004 |
| JP | 04647386 B2 | 3/2011 |
| WO | 8802412 A1 | 4/1988 |
| WO | 8803668 A1 | 5/1988 |
| WO | 2005/035628 A1 | 4/2005 |

OTHER PUBLICATIONS

European Search Report corresponding to application No. 15169155.7 dated Aug. 5, 2015.
Qian, "Two part epoxy-siloxane hybrid corrosion protection coatings for carbon steel",Thin Solid Films, 2008, vol. 517, pp. 5235-5242.
Felmet, et al, "Patterning conductive copper by nanotransfer printing", Applied Physics Letters, Oct. 2004, vol. 85, No. 15, pp. 3316-3318.
Yingya, et al, "Chemical modification of polyester fibers with amide-siloxane film and its antimicrobial property by electro-less silver plating", Advanced Materials Research, 2011, vol. 302, pp. 154-159.
Geissler, et al, "Direct patterning of NiB on glass substrates using microcontact printing and electroless deposition", Langmuir, 2003, vol. 19, pp. 6283-6296.
Tiawan Search Report corresponding to application No. 104116767 dated Jul. 22, 2016.

* cited by examiner

*Primary Examiner* — Kuo-Liang Peng
(74) *Attorney, Agent, or Firm* — John J. Piskorski

(57) ABSTRACT

Copolymers of diglycidyl ether terminated polysiloxane compounds and non-aromatic polyamines are used in the preparation of dielectric materials for electroless metal plating. The copolymers may be used in the manufacture of printed circuit boards such as in cleaning and conditioning through-holes prior to electroless metallization.

3 Claims, 2 Drawing Sheets

US 9,499,912 B2

COPOLYMERS OF DIGLYCIDYL ETHER TERMINATED POLYSILOXANE COMPOUNDS AND NON-AROMATIC POLYAMINES

FIELD OF THE INVENTION

The present invention is directed to copolymers of diglycidyl ether terminated polysiloxane compounds and non-aromatic polyamines. More specifically, the present invention is directed to copolymers of diglycidyl ether terminated polysiloxane compounds and non-aromatic polyamines for cleaning and conditioning dielectrics prior to electroless metallization.

BACKGROUND OF THE INVENTION

The electronics industry desires a metallized coating on dielectric materials for functional and aesthetic purposes. A particularly important technological area where the techniques of metallization of dielectric materials have found applicability is in the manufacture of printed circuit boards, where metallization is used to provide patterned, conductive circuitry on substrates with dielectric materials. Metallization of dielectric materials may come into play at a number of steps in the overall process of printed circuit board manufacture. One area of substantial importance is the electroless metallization of through-holes.

Typically, printed circuit boards are planar and have printed circuits on both sides. The boards may be multi-layer and contain laminates of dielectric substrates and conductive metal such as copper, where one or more parallel inner layers of conductive metal are separated by dielectric substrates. Exposed outer sides of the laminate contain printed circuit patterns as in double-sided boards and the inner conductive layers may themselves comprise circuit patterns. In double-sided and multi-layer printed circuit boards, it is necessary to provide conductive interconnection between or among the various layers or sides of the boards. This is achieved by providing metallized, conductive through-holes in the boards communicating with the sides and layers requiring electrical interconnection. Typically the method for providing conductive through-holes is by electroless deposition of metal on the dielectric surfaces of the through-holes drilled or punched through the boards.

Electroless deposition of metal on dielectric surfaces typically involves applying a material which is catalytic to the electroless plating process to the dielectric surfaces. This is known as "activation" of the through-hole surfaces. Such catalytic material may be a noble metal such as palladium. When plating through-holes with copper, the catalyst is often a colloidal solution of palladium and tin compounds. The tin functions as a protective colloid for the catalytic palladium. In many cases the activation is followed by an "acceleration" step which serves in some manner to expose or increase exposure of the active catalytic species.

Notwithstanding the fact that the topography of the through-hole surfaces can be such, e.g., roughened or pitted, as to promote adhesion of catalysts for electroless metal deposition, the properties of the dielectric substrate material may still lead to poor adhesion. A primary example of this is found in the glass-filled epoxy resins which are used extensively in the printed circuit board industry as the dielectric substrate. Poor palladium catalyst adsorption leads to incomplete or too thin coverage of subsequently electrolessly plated copper in the through-holes. A possible explanation for this is that the glass fibers have a highly negative surface charge and do not attract the typical tin-palladium catalyst which also carries a negative charge. However, the problem of poor metal coverage in through-holes is not restricted to glass-containing dielectric substrates and also occurs in substrates with any number of a variety of non-glass-containing, dielectric materials used as circuit board substrates. Complete metal coverage of through-holes is important.

In response to the problem of poor metal coverage of epoxy-glass substrates, the printed circuit board industry addressed the problem by using a process known as "conditioning" prior to application of the catalyst. Conditioning agents are compounds or mixtures of compounds which function to improve the adsorption of activating material on substrate surfaces to improve subsequent electroless metal plating quality. The exposed through-hole surfaces are coated with the conditioning agents and the catalytic species builds up on the coating and adheres to the surface.

Although conditioning through-hole walls results in improved metal coverage in contrast to non-conditioned through-holes, coverage of through-holes in glass-epoxy substrates as well as other types of dielectric substrates with many current conditioning agents does not always meet industry standards. Accordingly, there is still a need for an improved conditioner for electroless metallization of dielectric substrates.

SUMMARY OF THE INVENTION

Copolymers include a reaction product of one or more diglycidyl ether terminated polysiloxane compounds and one or more non-aromatic polyamines.

Compositions include a reaction product of one or more diglycidyl ether terminated polysiloxane compounds and one or more non-aromatic polyamines; and one or more organic solvents.

Methods include providing a substrate comprising a dielectric; contacting the substrate with a composition comprising a reaction product of one or more diglycidyl ether terminated polysiloxane compounds and one or more non-aromatic polyamines; applying a catalyst to the substrate; and electrolessly metal plating the substrate.

The conditioner compositions and methods provide good metal coverage of dielectric materials. The copolymers and methods also may reduce the undesirable ring of pearls or voids often found on incompletely metal plated though-hole walls of dielectric materials used in the electronics industry. Such ring of pearls may result in defects in electronic devices.

DETAILED DESCRIPTION OF THE INVENTION

Figure 1:
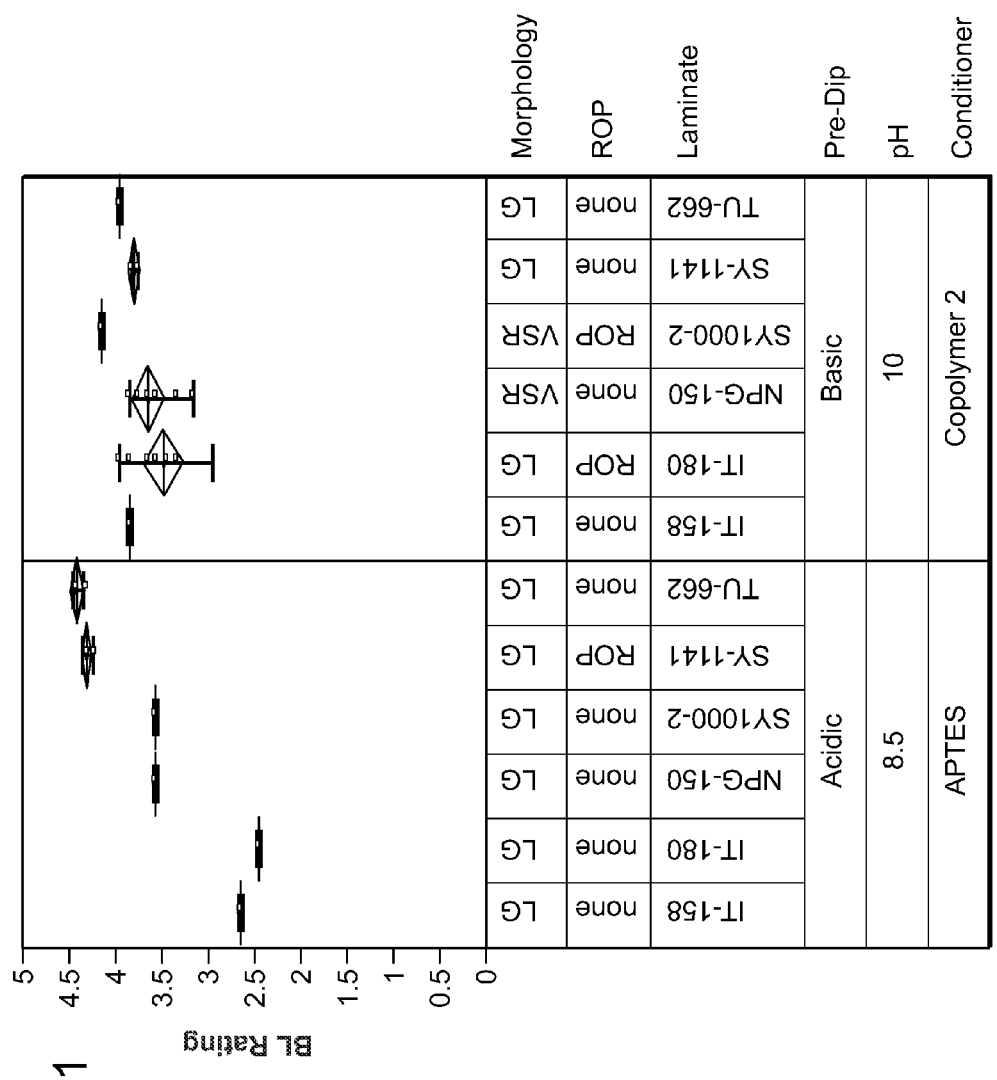
FIG. 1 shows backlight measurement comparisons of electroless copper plating of through-holes of various copper clad test panels treated with conditioners containing 3-aminopropyltriethoxysilane, and a reaction product of tetraethylenepentamine and diglycidyl ether terminated poly (dimethylsiloxane)

As used throughout this specification, the abbreviations given below have the following meanings, unless the context clearly indicates otherwise: g=gram; mg=milligram; mL=milliliter; L=liter; ppm=parts per million; M=molar; °C.=degrees Centigrade; g/L=grams per liter; DI=deionized; Mw=weight average molecular weight; Mn=number average molecular weight; wt %=percent by weight; $T_g$=glass transition temperature; EO/PO=ethylene oxide/propylene oxide; APTES=3-aminopropyltriethoxysilane; ROP=ring of pearls; SROP=slight ring of pearls; sev-ROP=severe ring of pearls; LG=looks good; R=rough; SR=slightly rough; VSR=very slightly rough; TETA=triethylenetetramine and TEPA=tetraethylenepentamine.

The term "monomer" or "monomeric" means a single molecule or compound which may combine with one or more of the same, similar or dissimilar molecules. The term "copolymer" means a polymer produced by the simultaneous polymerization of two or more dissimilar monomers. The term "polyamine" means a compound which includes at least two amine groups. The term "alkylamine" includes, but is not limited to: linear and branched, cyclic and acyclic polyalkylamines, including but not limited to ethylenediamine, diethylenetriamine, triethylenetetramine, tetraethylenepentamine, pentaethylenehexamine, and piperazine. The term "moiety" means a part of a molecule which may include whole functional groups or parts of functional groups. The terms "plating" and "deposition" are used interchangeably throughout this specification. The term "a" and "an" may refer to both the singular and the plural. All amounts are percent by weight, unless otherwise noted. All numerical ranges are inclusive and combinable in any order except where it is logical that such numerical ranges are constrained to add up to 100%.

Copolymers include a reaction product of one or more diglycidyl ether terminated polysiloxane compounds and one or more non-aromatic polyamines. The copolymers may be used in conditioner compositions in the preparation of dielectric materials for adsorbing a catalyst for electroless metallization of the dielectric materials. The conditioner compositions provide good metal coverage of dielectric materials including walls of through-holes and vias such as are found in printed circuit boards. The conditioner compositions may also reduce the undesirable "ring of pearls" on the walls of through-holes and vias. The ring of pearls is sections of the through-hole or via where metal is not deposited during the electroless metal plating process. They are voids which circumvallate the walls of through-holes and vias and may compromise the performance of electronic devices which include the printed circuit boards.

Diglycidyl ether terminated polysiloxane compounds include, but are not limited to compounds having a general formula:

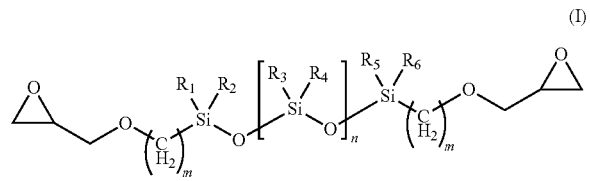

where $R_1$, $R_2$, $R_3$, $R_4$, $R_5$ and $R_6$ may be the same or different and are chosen from hydrogen; linear or branched, substituted or unsubstituted $(C_1-C_6)$alkyl; m is an integer of 1 to 6, and n is an integer of 1 to 20. Preferably $R_1$, $R_2$, $R_3$, $R_4$, $R_5$ and $R_6$ are the same or different and are chosen from linear or branched, substituted or unsubstituted $(C_1-C_6)$ alkyl. More preferably $R_1$, $R_2$, $R_3$, $R_4$, $R_5$ and $R_6$ are the same or different and are chosen from unsubstituted, linear $(C_1-C_3)$alkyl. Preferably m is an integer of 1 to 3 and n is an integer of 1 to 10. Substituent groups include, but are not limited to: hydroxyl; linear or branched hydroxy$(C_1-C_3)$ alkyl; and linear or branched $(C_1-C_5)$alkoxy. Such diglycidyl ether terminated polysiloxane compounds may have Mw from 200 to 7000 and/or Mn from 200 to 7000. Diglycidyl ether terminated polysiloxane compounds may be made according to methods disclosed in the literature, known in the art or may be commercially obtained from suppliers such as Gelest, Inc.

Non-aromatic polyamines include aliphatic and alicyclic polyamines. The non-aromatic polyamines include at least two amine moieties which may react with the diglycidyl ether terminated polysiloxane compounds. The amine moieties which react with the diglycidyl ether terminated polysiloxane compounds may be primary or secondary amine moieties. Preferably such non-aromatic polyamines include, but are not limited to: compounds having a general formula:

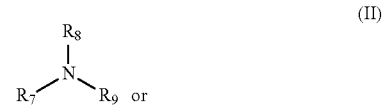

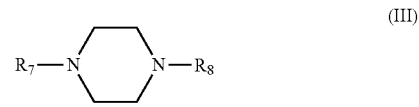

where $R_7$, $R_8$ and $R_9$ are independently chosen from hydrogen; linear or branched, substituted or unsubstituted $(C_1-C_{10})$alkylamine; linear or branched, substituted or unsubstituted $(C_1-C_{10})$alkyl; or a moiety having the general formula:

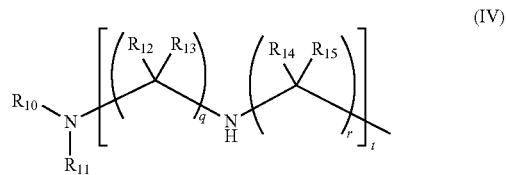

where $R_{10}$ and $R_{11}$ are independently chosen from hydrogen; linear or branched, substituted or unsubstituted $(C_1-C_{10})$ alkyl; linear or branched, substituted or unsubstituted $(C_1-C_{10})$alkylamine; and with the proviso that if the nitrogen atoms in compounds II and III are tertiary, at least one of $R_7$, $R_8$, and $R_9$ include substituent groups with at least two primary nitrogen atoms, secondary nitrogen atoms, or a combination of primary and secondary nitrogen atoms; $R_{12}$ through $R_{15}$ are independently chosen from hydrogen; linear or branched, substituted or unsubstituted $(C_1-C_{10})$alkyl; and linear or branched, substituted or unsubstituted $(C_1-C_{10})$ alkylamine; and q, r and t may be the same or different and are integers of 1 to 10. Preferably $R_{10}$ through $R_{15}$ are hydrogen. Substituent groups include, but are not limited to: hydroxyl; hydroxy$(C_1-C_3)$alkyl; $(C_1-C_5)$alkoxy; and linear or branched $(C_1-C_{10})$alkylamine. Preferably at least one of $R_7$, $R_8$ and $R_9$ is formula (IV). More preferably, two of $R_7$, $R_8$ and $R_9$ are formula (IV) and the remainder hydrogen. Preferably q, r and t are the same or different and are 1 to 5, more preferably from 1 to 3. Such non-aromatic polyamines may be prepared from the literature, methods known in the art or obtained commercially such as from Sigma Aldrich.

There is no limitation on the methods which may be used to prepare the reaction products. Preferably, one or more non-aromatic amines are solubilized in one or more organic solvents with stirring at room temperature. Such organic solvents, preferably, are water miscible and include, but are not limited to: acetonitrile and water miscible alcohols such as isopropanol, ethanol and methanol. One or more diglycidyl ether terminated polysiloxane compounds is then added to the solution of the one or more non-aromatic amines with heating to raise the temperature of the solution from room temperature to 90° C. to 110° C. The solution is heated for 3 hours to 8 hours and then left to stir at room temperature overnight. Molar ratios of one or more non-aromatic amines to one or more diglycidyl ether terminated polysiloxane compounds in the reaction mixture may range from 4:1 to 1:1.

The reaction products may be included in conditioner compositions in amounts of 0.1 g/L to 15 g/L, preferably from 1 g/L to 5 g/L. The compositions may include one or more additives such as surfactants, complexing agents, wetting agents and pH adjusting agents. Surfactants include, but are not limited to: non-ionic surfactants and cationic surfactants. One or more surfactants may be included in conventional amounts. Preferably, they are included in amounts of 0.1 g/L to 20 g/L, more preferably from 0.5 g/L to 5 g/L. Examples of non-ionic surfactants are polyglycol ethers, ethylene oxide/propylene oxide copolymers, polyoxyethylene octylphenyl ethers, polyoxyethylene nonylphenyl ethers, and ethoxylated linear alcohols. An example of a cationic surfactant is quaternized polyvinylimidazole. One or more complexing agents may be included in conventional amounts. Preferably, they are included in amounts of 0.1 g/L to 5 g/L, more preferably, from 0.1 g/L to 1.5 g/L. Complexing agents include, but are not limited to: ethylenediaminetetraacetic acid; N-(2-hydroxyethyl)iminodiacetic acid; iminodiacetic acid; diethylenetriamine-N,N,N',N'',N''-pentaacetic acid; N-(5-(3-maleimidopropylamido)-1-carboxy-pentyl)iminodiacetic acid; nitrilotriacetic acid; N-(5-amino-1-carboxypentyl)iminodiacetic acid; ethylenediaminedi(o-hydroxyphenylacetic) acid; and N,N'-bis(2-hydroxybenzyl)ethylenediamine-N,N'-diacetic acid. One or more wetting agents may be included in conventional amounts. Preferably, they are included in 0.5 g/L to 8 g/L amounts, more preferably from 2 g/L to 5 g/L. Wetting agents include but are not limited to: alkanolamines such as monoethanolamine; triethanolamine; triisopropanolamine; N,N,N',N'-tetrakis(2-hydroxypropyl)ethylene diamine; amino-2-propanol; and bis(2-hydroxypropyl)amine pH adjusting agents include, but are not limited to: alkali metal hydroxides such as sodium hydroxide and potassium hydroxide. One or more of inorganic acids and organic acids may be used to adjust the pH. Inorganic acids include, but are not limited to: sulfuric acid, hydrochloric acid, nitric acid and phosphoric acid. Organic acids include, but are not limited to: monocarboxylic acids such as acetic acid and polycarboxylic acids such as citric acid. pH adjusting agent are included in amounts to maintain a pH of greater than 7, preferably from 8 to 12, more preferably from 8.5 to 11. The conditioner compositions may be raised to their desired volume level and component concentrations using one or more of water and water miscible organic solvents. Preferably, the conditioner compositions consist essentially of one or more reactions products, one or more water miscible organic solvents, one or more surfactants, one or more complexing agents, one or more wetting agents, one or more pH adjusting agents and water.

The conditioner compositions may be used to condition dielectric materials including through-hole and via walls for the reception of many conventional catalysts used for electroless metal plating including but not limited to: conventional tin-palladium colloidal catalysts and ionic catalysts. Preferably, the conditioner compositions are used to prepare dielectric materials including through-hole and via walls for the reception of ionic catalysts. Such ionic catalysts preferably are aqueous alkaline non-colloidal solutions of complexes of metal ions and one or more complexing agents. Preferably, aqueous alkaline ionic catalysts are free of tin, tin ions, antioxidants and halogens. The pH range of the aqueous alkaline ionic catalyst solutions is from 8.5 and greater, preferably from 9 and greater, more preferably from 9 to 13, most preferably from 9 to 12. In general, the catalytic metal ions are not reduced to their metal state until after the catalyst is applied to the conditioned dielectric material. Conventional reducing agents may be used. Such reducing agents include, but are not limited to: dimethylamine borane, sodium borohydride, ascorbic acid, iso-ascorbic acid, sodium hypophosphite, hydrazine hydrate, formic acid and formaldehyde. Preferably the reducing agent is sodium hypophosphite or dimethylamine borane. Reducing agents are included in amounts to reduce substantially all of the metal ions to metal. Such amounts are generally conventional amounts and are well known by those of skill in the art.

Metal ions may be provided by conventional metal salts. Typically such metal salts are included in the catalyst solutions to provide metal ions in amounts of 20 ppm to 2000 ppm, preferably from 25 ppm to 500 ppm. Metal ions include, but are not limited to: silver, gold, platinum, palladium, copper, cobalt and nickel ions. Preferably, the metal ions are chosen from silver and palladium ions. Most preferably the metal ions are palladium ions. Metal ions may be provided by using conventional water soluble metal salts which are well known in the art and may be found in the literature.

In general, the amount of complexing compounds and one or more metal ions included in the aqueous alkaline ionic catalyst solutions are such that a molar ratio of complexing compounds to metal ions is from 1:1 to 4:1, preferably from 1:1 to 2:1. Complexing agents include, but are not limited to: pyrazine derivatives and pyrimidine derivatives. Pyrazine derivatives include, but are not limited to: 2,6-dimethylpyrazine, 2,3-dimethylpyrazine, 2,5-dimethylpyrazine, 2,3,5-trimethylpyrazine, 2-acetylpyrazine, aminopyrazine, ethylpyrazine, methoxypyrazine, and 2-(2'-hydroxyethyl)pyrazine. Pyrimidine derivatives include, but are not limited to: barbituric acid, orotic acid, thymine, 2-aminopyrimidine, 6-hydroxy-2,4-dimethylpyrimidine, 6-methyluracil, 2-hydroxypyrimidine, 4,6-dichloropyrimidine, 2,4-dimethoxypyrimidine, 2-amino-4,6-dimethylpyrimidine, 2-hydroxy-4,6-dimethylpyrimidine and 6-methylisocytosine.

The conditioner compositions may be used to prepare various dielectric materials for catalyst reception for electroless metal plating. The dielectric materials may be included on various substrates such as semiconductors, metal-clad and unclad substrates such as printed circuit boards with a plurality of through-holes, vias or combinations thereof. Such metal-clad and unclad printed circuit boards may include thermosetting resins, thermoplastic resins and combinations thereof, including fiber, such as fiber-glass, and impregnated embodiments of the foregoing. Preferably the substrate is a metal-clad printed circuit or wiring board with a plurality of through-holes, vias or combinations thereof.

The conditioner compositions may be used in both horizontal and vertical processes of manufacturing printed circuit boards. The conditioner compositions may be used with conventional aqueous alkaline electroless metal plating baths. While it is envisioned that the conditioners may be used in methods for electrolessly plating any metal which may be electrolessly plated, preferably, the metal is chosen from copper, copper alloys, nickel or nickel alloys. More preferably the metal is chosen from copper and copper alloys, most preferably copper is the metal. Conventional metal electroless plating baths may be used. Various electroless baths are well known in the art and disclosed in the literature. Examples of commercially available electroless copper plating baths are CIRCUPOSIT™ 4500 and CIRCUPOSIT™ 880 Electroless Copper baths (available from Dow Advanced Materials, Marlborough, Mass.).

Conventional steps for electroless metal plating a substrate with dielectric material may be used with the conditioner composition; however, the aqueous alkaline ionic catalysts do not require an acceleration step where tin is stripped to expose the palladium metal for electroless plating when a colloidal tin-palladium catalyst is used. Preferably, the conditioner compositions are applied to the substrate with the dielectric material at temperatures from room temperature to 90° C., preferably from 30° C. to 80° C. The conditioner may be applied to the substrate by immersing the substrate in the conditioner or the conditioner may be sprayed on the substrate. The conditioner may be in contact with the substrate for 30 seconds to 180 seconds before the substrate is optionally rinsed with water. A catalyst is applied to the conditioned substrate to be electrolessly plated with a metal. If the catalyst is an ionic type catalyst a reducing agent is subsequently applied to the substrate, otherwise, as in the case of a tin-palladium catalyst, the catalytic metal ion is already reduced to the metal state during catalyst application. Electroless metal plating parameters, such as temperature and time may be conventional. The pH of the electroless metal plating bath is typically alkaline. Conventional substrate preparation methods, such as cleaning or degreasing the substrate surface, roughening or micro-roughening the surface, etching or micro-etching the substrate, solvent swell applications, desmearing through-holes and various rinse and anti-tarnish treatments may be used. Such methods and formulations are well known in the art and disclosed in the literature.

Preferably, the substrate to be metal plated is a metal-clad substrate with dielectric material and a plurality of through-holes, vias or combinations thereof such as a printed circuit board. The boards may be rinsed with water and cleaned and degreased followed by desmearing the through-hole walls and vias. Typically prepping or softening the dielectric or desmearing of the through-holes and vias begins with application of a solvent swell. Typically, rinsing the substrate with water is done between each step.

Any conventional solvent swell may be used. The specific type may vary depending on the type of dielectric material. Minor experimentation may be done to determine which solvent swell is suitable for a particular dielectric material. The $T_g$ of the dielectric may determine the type of solvent swell to be used. Solvent swells include, but are not limited to: glycol ethers and their associated ether acetates. Conventional amounts of glycol ethers and their associated ether acetates may be used. Examples of commercially available solvent swells are CIRCUPOSIT™ MLB Conditioner 211 solution, CIRCUPOSIT™ Hole Prep 3303 and CIRCUPOSIT™ Hole Prep 4120 solutions (available from Dow Advanced Materials).

After the solvent swell, a promoter may be applied. Conventional promoters may be used. Such promoters include sulfuric acid, chromic acid, alkaline permanganate or plasma etching. Typically alkaline permanganate is used as the promoter. Examples of commercially available promoters are CIRCUPOSIT™ Promoter 4130 and CIRCUPOSIT™ MLB Promoter 3308 solutions (available from Dow Advanced Materials). Optionally, the substrate is rinsed with water.

A neutralizer may then be applied to neutralize any residues left by the promoter. Conventional neutralizers may be used. Typically the neutralizer is an aqueous acidic solution containing one or more amines or a solution of 3 wt % hydrogen peroxide and 3 wt % sulfuric acid. An example of a commercially available neutralizer is CIRCUPOSIT™ MLB Neutralizer 216-5 solution (available from Dow Advanced Materials). Optionally, the substrate and through-holes are rinsed with water and then dried.

After neutralization, a conditioner composition with one or more reaction products of one or more diglycidyl ether terminated polysiloxane compounds and one or more non-aromatic polyamines as described above is applied to the substrate. Optionally, the substrate is rinsed with water.

Conditioning may be followed by micro-etching. Conventional micro-etching compositions may be used. Micro-etching is designed to provide a micro-roughened metal surface on exposed metal (e.g. inner layers and surface) to enhance subsequent adhesion of plated electroless metal and later electroplate. Micro-etches include, but are not limited to: 60 g/L to 120 g/L sodium persulfate or sodium or potassium oxymonopersulfate and sulfuric acid (2%) mixture, or generic sulfuric acid/hydrogen peroxide. Examples of commercially available micro-etching compositions are CIRCUPOSIT™ Etch 3330 solution and PREPOSIT™ 748 Etch solution, both available from Dow Advanced Materials. Optionally, the substrate is rinsed with water.

Optionally, a pre-dip may then be applied to the micro-etched substrate. Pre-dip components include but are not limited to: organic salts such as sodium potassium tartrate, sodium carbonate or sodium citrate, nitric acid, sulfuric acid or an acidic solution of 25 g/L to 75 g/L sodium sulfate.

The catalyst is then applied to the substrate. Application may be done by conventional methods used in the art, such as immersing the substrate in a solution of the catalyst or by spraying using conventional apparatus. Catalyst dwell time may range from 1 minute to 10 minutes, typically from 2 minutes to 8 minutes for vertical equipment and for 25 seconds to 120 seconds for horizontal equipment. The catalysts may be applied at temperatures from room temperature to 80° C., typically from 30° C. to 60° C. The substrate optionally may be rinsed with water after application of the catalyst.

If the catalyst is an ionic catalyst where the catalytic metal ions have not yet been reduced to their metal state, a reducing solution is then applied to the substrate to reduce the metal ions of the catalyst to metal. The reducing solution may be applied by immersing the substrate into the reducing solution or spraying the reducing solution on the substrate. The temperature of the solution may range from room temperature to 65° C., typically from 30° C. to 55° C. Contact time between the reducing solution and the catalyzed substrate may range from 30 seconds to 5 minutes before application of the electroless metal plating bath.

The substrate is then electrolessly plated with metal, such as copper, copper alloy, nickel or nickel alloy using an electroless bath. Preferably copper is plated on the walls of the through-holes and vias of the substrate. Plating times and temperatures may be conventional. Typically metal deposition is done at room temperature to 80° C., more typically from 30° C. to 60° C. The substrate may be immersed in the electroless plating bath or the electroless bath may be sprayed on the substrate. Typically, electroless plating may be done for 5 seconds to 30 minutes; however, plating times may vary depending on the thickness of the metal desired. Plating is preferably done in an alkaline environment to prevent undesired corrosion of any metal cladding on the substrate. Typically the pH of the plating solution is 8 and higher, preferably the pH is 8.5 and greater, more preferably the pH is from 9 to 13, most preferably the pH is from 9 to 12.

Optionally anti-tarnish may be applied to the metal. Conventional anti-tarnish compositions may be used. An example of anti-tarnish is ANTI TARNISH™ 7130 solution (available from Dow Advanced Materials). The substrate may optionally be rinsed with water and then dried.

Further processing may include conventional processing by photoimaging and further metal deposition on the substrates such as electrolytic metal deposition of, for example, copper, copper alloys, tin and tin alloys.

The conditioner compositions and methods provide good metal coverage of dielectric materials and through-hole walls and vias. The copolymers and methods also may reduce the undesirable ring of pearls typically found on the walls of incompletely metal plated through-holes which may result in defects in electronic devices in which the substrates are used.

The following examples are not intended to limit the scope of the invention but to further illustrate the invention.

Example 1

Copolymer 2 was prepared by dissolving technical grade tetraethylenepentamine (11.86 g, 0.062 mol) in 20 mL isopropanol in a 100 mL round-bottom, three-neck flask equipped with condenser, thermometer, and stir bar at room temperature. Diglycidyl ether terminated poly(dimethylsiloxane) (Mn~800, 25.04 g, 0.031 mol) was added dropwise to the solution, and the vial containing the diglycidyl ether terminated poly(dimethylsiloxane) was rinsed with 2 mL isopropanol. The heating bath temperature was increased to 96° C. The resulting mixture was heated for 4 hours and then the reaction was left to stir at room temperature overnight. The reaction mixture was rinsed with water into a polyethylene bottle for storage. The molar ratio of tetraethylenepentamine to diglycidyl ether terminated poly(dimethylsiloxane) was determined to be 2:1 based on monomer molar ratios.

Copolymers 1 and 3-8 were prepared substantially according to the method by which copolymer 2 was prepared. TETA and TEPA DOW amine mixtures were used as is, with molecular weights assumed to be those of triethylenetetramine and tetraethylenepentamine, respectively.

| Copolymer | Monomer 1 (M₁) | Monomer 2 (M₂) |
| --- | --- | --- |
| 1 | <br>Diethylenetriamine | 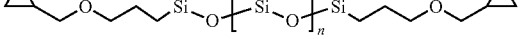<br>Mn 800<br>Diglycidyl ether terminated poly(dimethylsiloxane) |
| 2 | <br>Tetraethylenepentamine | <br>Mn 800<br>Diglycidyl ether terminated poly(dimethylsiloxane) |
| 3 | <br> | <br>Mn 800<br>Diglycidyl ether terminated poly(dimethylsiloxane) |

| Copolymer | Monomer 1 (M₁) | Monomer 2 (M₂) |
|---|---|---|
| | 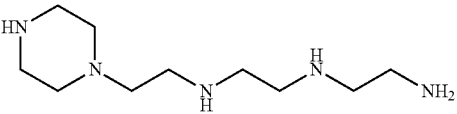<br>TETA Dow Amine Mix | |
| 4 | 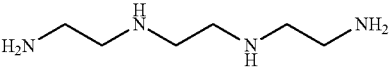 | 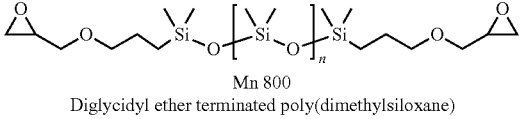<br>Mn 800<br>Diglycidyl ether terminated poly(dimethylsiloxane) |
| | 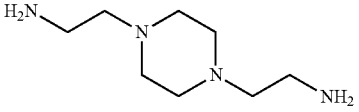<br>TEPA Dow Amine Mix | |
| 5 | 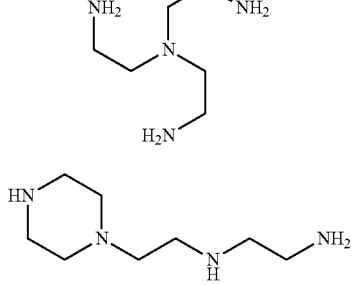<br>Triethylenetetramine | 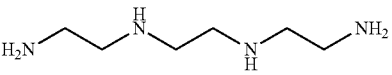<br>Mn 800<br>Diglycidyl ether terminated poly(dimethylsiloxane) |
| 6 | 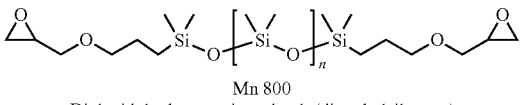<br>Pentaethylenehexamine | 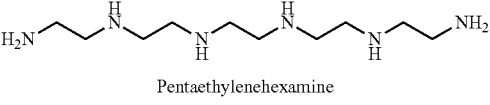 [SMILES: NCCNCCNCCNCCNCCN]<br>Mn 800<br>Diglycidyl ether terminated poly(dimethylsiloxane) |
| 7 | 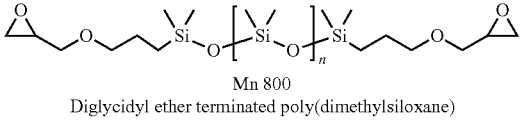<br>Tetraethylenepentamine | 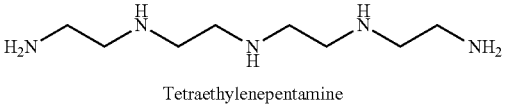 [SMILES: NCCNCCNCCNCCN]<br>Mw 363<br>Diglycidyl ether terminated poly(dimethylsiloxane) |
| 8 | 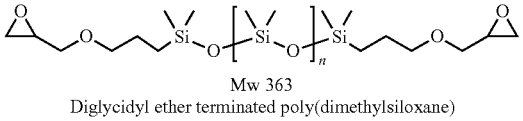<br>Tetraethylenepentamine | 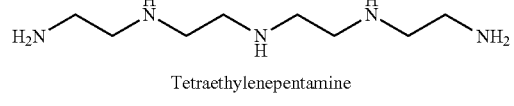<br>Mw 500-600<br>Diglycidyl ether terminated poly(dimethylsiloxane) |

Example 2

Comparisons were done of electroless copper coverage on four-layer or eight-layer copper-clad test panels with a plurality of through-holes using three different conditioners. The panels were constructed from TUC-662, SY-1141, SY-1000-2, IT-158, IT-180 and NPG-150 laminates. TUC-662 was obtained from Taiwan Union Technology, SY-1141 and SY-1000-2 were obtained from Shengyi. The IT-158 and IT-180 are from ITEQ Corp. and the NPG-150 is from NanYa. Each panel was 5 cm×12 cm.

Aqueous conditioner solutions were prepared to include 1 g/L of conditioning agent, 4 g/L ethoxylated linear alcohol non-ionic surfactant, and sodium hydroxide or sulphuric acid to adjust the pH as necessary.

1. Each copper-clad panel was immersed in CIRCUPOSIT™ MLB Conditioner 211 solvent swell solution at 75° C. for 2 minutes, then rinsed with flowing tap water for 2 minutes;
2. The panels were immersed in CIRCUPOSIT™ MLB Promoter 3308 permanganate solution at 80° C. for 3 minutes and then rinsed with flowing tap water rinse for 2 minutes;
3. Each panel was immersed in an aqueous neutralizer solution of 3% sulfuric acid and 3% hydrogen peroxide at room temperature for 1 minute followed by rinsing for 2 minutes with flowing tap water;
4. The panels were then immersed in one of two conditioner solutions: APTES at 60° C., and copolymer 2 in the table of Example 1 at 60° C. for 90 seconds followed by rinsing with flowing tap water for 2 minutes;
5. The panels were then etched with a solution of 1% sulfuric acid and 75 g/L sodium persulfate at room temperature for 40 seconds followed by rinsing for 1 minute with DI water;
6. Each panel was immersed in an acidic pre-dip of 1% nitric acid or 1 g/L potassium carbonate basic pre-dip at room temperature for 30 seconds;
7. An aqueous ionic catalyst of 200 ppm palladium ions, 208 ppm 2,6-dimethylpyrazine and 1 g/L potassium carbonate with pH adjusted to 9.5 using nitric acid was applied to the panels at 40° C. for 2 minutes followed by rinsing the panels with DI water for 30 seconds;
8. Each panel was then immersed in a 0.25M sodium hypophosphite reducing agent solution at 50° C. for 90 seconds followed by rinsing with DI water for 20 seconds;
9. The panels were immersed in CIRCUPOSIT™ 4500 Electroless Copper bath at 52° C. for 5 minutes to plate copper on the walls of the through-holes of the panels;
10. After copper plating the panels were rinsed with flowing tap water for 4 minutes.

Each panel was cross-sectioned nearest to the centers of the through-holes as possible to expose the copper plated walls. The cross-sections, no more than 3 mm thick from the center of the through-holes, were taken from each panel to determine the through-hole wall coverage. The European Backlight Grading Scale was used. The cross-sections from each panel were placed under a conventional optical microscope of 50× magnification with a light source behind the samples. The quality of the copper deposits was determined by the amount of light visible under the microscope that was transmitted through the sample. Transmitted light was only visible in areas of the plated through-holes where there was incomplete electroless coverage. If no light was transmitted and the section appeared completely black, it was rated a 5 on the backlight scale indicating complete copper coverage of the through-hole wall. If light passed through the entire section without any dark areas, this indicated that there was very little to no copper metal deposition on the walls and the section was rated 0. If sections had some dark regions as well as light regions, they were rated between 0 and 5. A minimum of ten through-holes were inspected and rated for each board.

A backlight rating distribution graph showing the backlight performance of the conditioners with the ionic catalyst for each plated panel is shown in FIG. 1. The plots in the graph indicate a 95% confidence interval for the backlight ratings of ten through-holes sectioned for each board. The horizontal line through the middle of each plot indicates the average backlight value for each group of ten through-hole sections measured. The conditioner which included copolymer 2 had the overall best combination of through-hole wall coverage, ROP performance and copper morphology.

Example 3

Comparison of electroless copper coverage on four-layer or eight-layer copper-clad test panels with a plurality of through-holes constructed from NP-175, 370HR, TUC-752, TUC-662, SY-1141, SY-1000-2, IT-158, NPG-150, and IT-180 laminate materials was done using the conditioners of copolymers 1-8 from the table in Example 1. The conditioner solutions were prepared as described in Example 2. Each panel was 5 cm×12 cm and was treated as follows:

Each copper-clad panel was immersed in CIRCUPOSIT™ MLB Conditioner 211 solvent swell solution at 75° C. for 2 minutes, then rinsed with flowing tap water for 2 minutes;
1. The panels were immersed in CIRCUPOSIT™ MLB Promoter 3308 permanganate solution at 80° C. for 3 minutes and then rinsed with flowing tap water rinse for 2 minutes;
2. Each panel was immersed in an aqueous neutralizer solution of 3% sulfuric acid and 3% hydrogen peroxide at room temperature for 1 minute followed by rinsing for 2 minutes with flowing tap water;
3. The panels were then immersed in one of eight copolymer conditioner solutions at 60° C. for 90 seconds followed by rinsing with flowing tap water for 2 minutes;
4. The panels were then etched with a solution of 1% sulfuric acid and 75 g/L sodium persulfate at room temperature for 40 seconds followed by rinsing for 1 minute with DI water;
5. Each panel was immersed in a 1 g/L potassium carbonate basic pre-dip at room temperature for 30 seconds;
6. An aqueous ionic catalyst of 200 ppm palladium ions, 225 ppm 6-hydroxy-2,4-dimethylpyrimide and 1 g/L potassium carbonate with pH adjusted to 9.5 using nitric acid was applied to the panels at 40° C. for 2 minutes followed by rinsing the panels with DI water for 30 seconds;
7. Each panel was then immersed in a 0.25M sodium hypophosphite reducing agent solution at 50° C. for 90 seconds followed by rinsing with DI water for 20 seconds;
8. The panels were immersed in CIRCUPOSIT™ 4500 Electroless Copper bath at 52° C. for 5 minutes to plate copper on the walls of the through-holes of the panels;
9. After copper plating the panels were rinsed with flowing tap water for 4 minutes.

Figure 2:
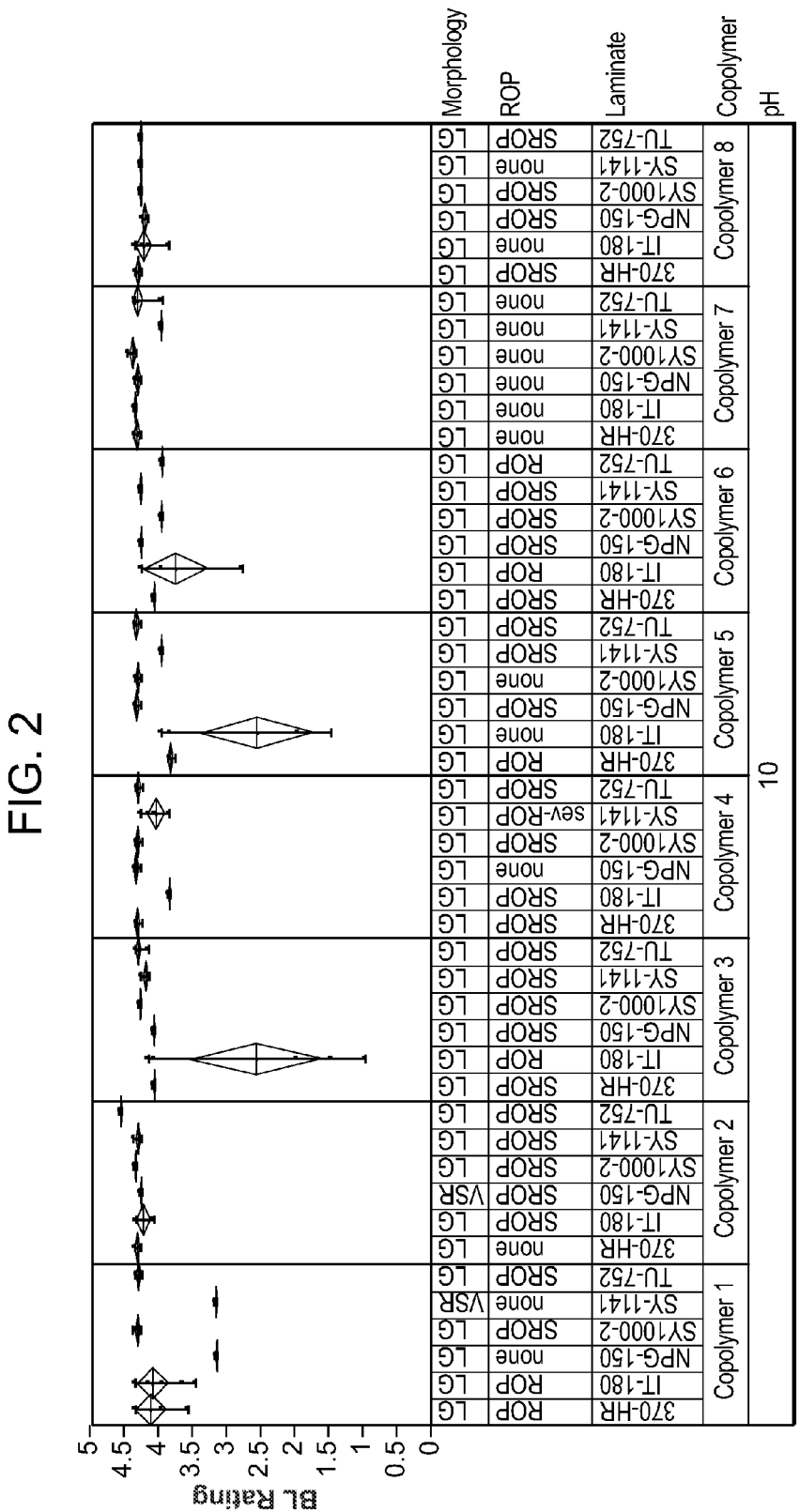
FIG. 2 shows backlight measurement comparisons of electroless copper plating of through-holes of various copper clad test panels treated with seven different conditioners of reaction products of polysiloxane diglycidyl ethers and non-aromatic polyamines.

Morphology of each panel is shown in FIG. 2. Good to very slightly rough morphologies were observed across all plated laminates. The panels were examined for ROP with a conventional optical microscope of 50× magnification.

Each panel was cross-sectioned nearest to the centers of the through-holes as possible to expose the copper plated walls as described in Example 2. The European Backlight Grading Scale was used. The cross-sections from each panel were placed under a conventional optical microscope of 50× magnification with a light source behind the samples. The quality of the copper deposits was determined by the amount of light visible under the microscope that was transmitted through the sample as described above in Example 2. FIG. 2 is a backlight rating distribution graph showing the backlight performance of the conditioners with the ionic catalyst for each plated panel. The plots in the graph indicate a 95% confidence interval for the backlight ratings of ten through-holes sectioned for each board. Although all of the copolymers had overall good through-hole wall coverage, ROP performance and copper morphology, the conditioner which included copolymer 2 had the overall best performance.

What is claimed is:

1. A composition comprising a reaction product of one or more diglycidyl ether terminated polysiloxane compounds and one or more non-aromatic polyamines chosen from aliphatic polyamines having a formula:

(II)

wherein $R_7$, $R_8$ and $R_9$ are independently chosen from hydrogen; linear or branched, substituted or unsubstituted $(C_1\text{-}C_{10})$alkylamine; linear or branched, substituted or unsubstituted $(C_1\text{-}C_{10})$alkyl; a moiety having a general formula:

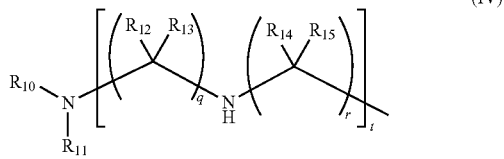

(IV)

wherein $R_{10}$ to $R_{15}$ are independently chosen from hydrogen; linear or branched, substituted or unsubstituted $(C_1\text{-}C_{10})$alkyl; linear or branched, substituted or unsubstituted, $(C_1\text{-}C_{10})$alkylamine; and with the proviso that if the nitrogen atoms in compound II is tertiary, at least one of $R_7$, $R_8$ and $R_9$ comprises substituent groups with two or more primary nitrogen atoms; and q, r and t may be the same or different and are integers of 1 to 10; and acetonitrile.

2. The composition of claim 1, wherein the one or more diglycidyl ether terminated polysiloxane compounds has a formula:

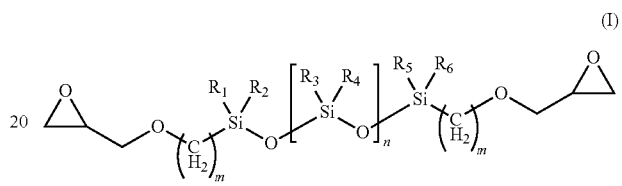

(I)

wherein $R_1$, $R_2$, $R_3$, $R_4$, $R_5$ and $R_6$ may be the same or different and are chosen from hydrogen; linear or branched, substituted or unsubstituted $(C_1\text{-}C_6)$alkyl; m is an integer of 1 to 6, and n is an integer of 1 to 20.

3. The composition of claim 2, further comprising one or more additives elected from the group consisting of surfactants and pH adjusters.

* * * * *